United States Patent [19]

Granger et al.

[11] Patent Number: 5,569,493
[45] Date of Patent: Oct. 29, 1996

[54] PREPARATION OF CURED CYANATE ESTER RESINS AND COMPOSITES FOR METAL PLATING

[75] Inventors: Diana D. Granger, Thousand Oaks; Leroy J. Miller, West Hills, both of Calif.

[73] Assignee: Hughes Aircraft Company, Los Angeles, Calif.

[21] Appl. No.: 339,390

[22] Filed: Nov. 14, 1994

[51] Int. Cl.$^6$ .................................................... C23C 18/20
[52] U.S. Cl. ........................ 427/306; 205/164; 205/167; 205/169; 427/304; 427/307; 427/444
[58] Field of Search ............................ 205/167, 168, 205/169, 164, 165, 166; 427/304, 305, 306, 307, 443.1, 444; 528/488, 491

[56] References Cited

U.S. PATENT DOCUMENTS

| | | | |
|---|---|---|---|
| 3,642,584 | 2/1972 | Quinn et al. | 204/30 |
| 3,716,394 | 2/1973 | Waggoner et al. | 427/306 |
| 3,791,848 | 2/1974 | DeAngelo | 427/307 |
| 4,422,907 | 12/1983 | Birkmaier et al. | 205/50 |
| 5,286,530 | 2/1994 | Karas et al. | 427/437 |
| 5,443,865 | 8/1995 | Tisdale et al. | 427/304 |

OTHER PUBLICATIONS

"Chemical Treatments Designed to Improve Adhesion of Metals Deposited on the Surface of Cyanate Ester Composites", communication from Ciba–Geigy Corporation dated Jan. 1994.

*Primary Examiner*—John Niebling
*Assistant Examiner*—William T. Leader
*Attorney, Agent, or Firm*—V. D. Duraiswamy; W. K. Denson-Low

[57] ABSTRACT

A method is provided for preparing the surface of a cured cyanate ester resin or composite for metal plating. The composite may comprise graphite fibers embedded in a cured cyanate ester resin matrix The surface is treated with a preheated solution containing an alkali metal salt of an alkoxide. Preferred alkoxides are methoxide, ethoxide, propoxide, isopropoxide, butoxide, tert-butoxide, sec-tutoxide, 2- methyl-2-butoxide, pentoxide and hexoxide. The method of the invention operates to improve adhesion between the treated surface and a subsequently plated metal, such that the resulting cured cyanate ester resin or composite may replace certain metallic components in such applications as aircraft, spacecraft, and automobiles given its highly conductive metallic coating.

19 Claims, No Drawings

PREPARATION OF CURED CYANATE ESTER RESINS AND COMPOSITES FOR METAL PLATING

CROSS-REFERENCE TO RELATED APPLICATION

The present application is related to application Ser. No. 08/339,380, filed on even date herewith in the name of Camille I. van Ast, which is directed to a method for preparing the surface of cyanate ester polymers or cyanate ester polymer composites. The method of preparation includes a step of contacting the surface with a preheated solution comprising a compound selected from the group consisting of at least one quaternary ammonium hydroxide and at least one primary amine. The method of preparation in the present application includes a step of contacting the surface with a pre-heated solution comprising an alkali metal salt of an alkoxide.

BACKGROUND OF THE INVENTION

1. Field of the Invention

The present invention is directed to providing nonmetallic cured resins and composites with a conductive metal surface, and more particularly, to preparing the surface of a cured cyanate ester resin or composite for plating with metal.

2. Description of Related Art

Metals are commonly employed in manufacturing because they offer high degrees of ductility and strength as well as high conductivity. However, metals are generally heavier than other common materials like plastics, such that the positive characteristics attributable to metals often come at the cost of increased product weight. Increased product weight is particularly a concern in industries manufacturing vehicles of transport such as automobiles, aircraft, and spacecraft, as well as payloads of such vehicles, given that increased weight adversely affects fuel economy. Accordingly, these industries have increasingly incorporated nonmetallic, lighter-weight materials such as plastics into automobiles and aircraft in an effort to economize fuel.

However, plastics are not universally suitable as substitutes for metals. For example, while plastics offer high degrees of ductility and strength, plastics are relatively nonconductive materials. Thus, plastics cannot supplant metals used as electrical, thermal, or microwave conductors.

It would be desirable to plate a metal coating onto nonmetallic plastic, thereby simultaneously realizing the benefits of both metals and plastics. More specifically, metal plating on such commonly-used plastic materials as cured cyanate ester resins and composites would allow the use of these lighter-weight plastic materials for the bulk of components and would minimize the amount of metal required to achieve a highly conductive surface. However, plating metal onto many untreated plastic surfaces has been unsuccessful because these materials do not inherently adhere to one another.

There are methods available to improve the adhesion between metals and certain nonmetallic surfaces. One such process, commercially available from Shipley Chemicals, employs a series of treatment baths to clean, texturize, neutralize, condition, and etch the resin surfaces of circuit board composites in preparation for electroless copper processing. For example, the Shipley process employs an alkaline permanganate bath to texturize the resin surface and a persulfate-based micro-etch system to promote adhesion of the copper to the resin surface. While the Shipley process presumably improves the adhesiveness between copper and the surfaces of circuit boards, its multiple steps and numerous chemical compounds are cumbersome.

We have found that plating of metal coatings onto cyanate ester polymers and reinforced composites made with these polymers is particularly difficult. The previously described methods for plating metals on other polymers do not work satisfactorily for the cyanate ester polymers and their composites. A new and improved method for plating these materials would be very valuable, because the cyanate ester polymers and their composites have certain unique advantages that make them very useful for specific applications, such as applications in communications spacecraft. These polymers and composites can be formulated in ways that make them very resistant to even minute dimensional changes that would otherwise occur as a result of temperature changes or the absorption and desorption of moisture in the presence of air. Since these applications also require that the surface of these articles also have a high electrical conductivity, it is very useful and important to provide a method for plating metals on these plastics and composites.

Thus, a need remains for a method to improve adhesion of a metal coating to cured cyanate ester resins and composites. The method should consist of a minimal number of steps so that production rates may be optimized. The present invention fulfills these needs.

SUMMARY OF THE INVENTION

In accordance with the invention, a method is provided to prepare the surface of a cured cyanate ester resin or composite for metal plating such that the metal adequately adheres to the resin or composite surface. For purposes of brevity, the term "cured cyanate ester resin" is hereinafter intended to encompass both "cured cyanate ester resin" and "cured cyanate ester resin composite." The method of the invention comprises:

(a) providing a cured resin comprising a cyanate ester, the cured resin having a surface;

(b) placing the surface in contact with a preheated solution comprising an alkali metal salt of an alkoxide;

(c) removing the surface from contact with the preheated solution;

(d) rinsing the surface with a solution selected from the group consisting of water, alcohol, and a combination thereof; and (e) drying the surface, the surface thereby having been prepared to adhere to metal deposited by a subsequent metal plating process.

In sum, a method is provided to enable the successful metal plating of a cured cyanate ester resin, such that a highly conductive metal surface may be constructed on the resin. As a result, the method of the present invention enables industry to replace metallic components with lighter-weight cured cyanate ester resin components, given that these components may now be equipped with the requisite highly conductive surface. Metal-plated cured cyanate ester resins are particularly well-suited to replace certain metallic components given their low moisture absorption, their negligible coefficient of thermal expansion, and their strength.

The present invention is expected to have a positive economic impact on the automotive, aircraft, and spacecraft industries. The replacement of metallic compounds with lighter-weight cured cyanate ester resin components reduces total product weight, which leads to greater fuel efficiency in vehicles of transport. For example, each pound of weight eliminated from a satellite is estimated to save approximately $30,000 (in 1993 dollars) in the deployment and operation of satellites.

Accordingly, the method of the present invention offers a practical, effective method to prepare the surface of a cured cyanate ester resin for metal plating and to thereby enable the substitution of such resins for heavier metallic components.

DETAILED DESCRIPTION OF THE PREFERRED EMBODIMENTS

The present invention is directed to preparing the surface of a cured cyanate ester resin for plating with metal. More specifically, the method of the present invention involves treating the resin surface such that better adhesion is achieved between the plated metal and the cured resin.

While the method of the invention may serve to adequately prepare the surface of various cured resins and composites, it is specifically designed to treat the surface of cured cyanate ester resins and composites. Examples of cured cyanate ester resins benefited by the practice of the invention include cyanate ester resin RS3 available from YLA, cyanate ester resins BTCY-2 and X-1515 available from Bryte, and cyanate resin 954-3 available from Fiberite. Examples of graphite fibers combined with cyanate ester resins to form composites suitably employed in the practice of the invention include XN-80 carbon fibers available from YLA and T300 carbon fibers available from Fiberite.

In the practice of the invention, the surface of the cured resin is placed in contact with a preheated solution comprising an alkali metal salt of an alkoxide. The alkali metal salt thus comprises an alkali metal ion and an alkoxide ion (R-O$^-$), where R may be represented by an alkyl group, an aryl-alkyl group, a hydroxy-alkyl group, or an alkoxy-alkyl group. Preferably, the alkyl groups employed in the practice of the invention have chain lengths ranging from one to twelve carbon atoms, with chain lengths of one to six carbon atoms being most preferable. Specific preferred examples of alkoxide ions include methoxide, ethoxide, propoxide, iso-propoxide, butoxide, tert-butoxide, sec-butoxide, 2-methyl-2-butoxide, pentoxide, and hexoxide.

Further, it is also preferable that the alkali metal ion is either sodium (Na$^+$) or potassium (K$^+$). The alkoxide salt of the present invention may be represented by such compounds as sodium methoxide, sodium ethoxide, sodium propoxide, sodium iso-propoxide, sodium butoxide, sodium tert-butoxide, potassium butoxide, potassium sec-butoxide, potassium tert-butoxide, sodium tert-pentoxide, sodium 2-methyl- 2-butoxide, or potassium 2-methyl-2-butoxide, all of which are readily available commercially from various sources that can be identified by reference to "Chem Sources—U.S.A.", which is published annually by Chemical Sources International, Inc. of Fernandina Beach, Fla. One can also readily synthesize any desired salt of this type by cautiously allowing the alkali metal to react in small portions with the appropriate dry alcohol, preferably under a blanket of inert gas. Caution must be exercised to prevent ignition of the hydrogen evolved in the process of this reaction. Usually the alcohol is used in excess, and the unreacted alcohol serves as a solvent for the metal alkoxide. Alternatively, if the alkoxide salt is available, the solution may be formed by dissolving it in the corresponding alcohol.

Preferably, the alcohol employed comprises a simple alkyl group attached to a hydroxyl group, with the alkyl group having a chain length ranging from one to twelve carbon atoms. More preferably, the alcohol has as its conjugate base the alkoxide ion of the alkoxide salt. For example, methanol is the preferred solvent for the alkoxide salt sodium methoxide. However, Example 4 below, in which the preheated solution comprises sodium methoxide and 1-butanol, illustrates that the preheated solution of the invention is not so limited. Other alcohols may also be used as the solvent, but it will be recognized that then the alkoxide that becomes the reagent may consist partially or almost entirely of the metal alkoxide salt derived from the alcohol that is used as the solvent. Alcohols that may be used as the solvent include methanol, ethanol, 1-propanol, 2-propanol, 1-butanol, 2-butanol (or sec-butyl alcohol), tert-butyl alcohol, 1-pentanol, 2-pentanol, 3-pentanol, tert-amyl alcohol, 1-hexanol, various isomeric hexanols, 1-heptanol, various isomeric heptanols, 1-octanol, various isomeric octanols, 1-nonanol, various isomeric nonanols, 1-decanol, various isomeric decanols, 1-undecanol, 2-undecanol, 1-dodecanol, 2-dodecanol, 2-ethylhexanol, 1,2-ethanediol, 1,2-propanediol, 1,3-propanediol, 1,2-butanediol, 1,3-butanediol, 1,4-butanediol, 2,3-butanediol, 1,5-pentanediol, 2-methoxyethanol, 2-ethoxyethanol, 2-butoxyethanol, diethylene glycol, diethylene glycol methyl ether, diethylene glycol ethyl ether, diethylene glycol butyl ether, diethylene glycol hexyl ether, triethylene glycol, triethylene glycol methyl ether, 2-phenylethanol, 3-phenyl-1-propanol, and the like. All of these alcohols are readily available commercially from various sources that can be identified by reference to "Chem Sources—U.S.A."

The alkoxide salt is effective at a concentration ranging from about 1 to 50 wt % or higher. It will be recognized that at low concentrations the reaction will become slow and require more time to achieve the desired effect, while for some alkoxide salts and some alcohols the solubility of the salt in the alcohol may be limited at high concentrations and the concentrated solution may become undesirably viscous.

Optionally, the cured cyanate resin surface may be pretreated to clean or soften and clean the surface in preparation for immersion in the preheated solution. For example, the surface may be pre-treated with such common organic solvents as acetone, methyl ethyl ketone, methyl isobutyl ketone, ethoxyethyl acetate (commercially known as Cellosolve Acetate), dioxane, toluene, hexane, heptane, chloroform, methylene chloride, and the like, prior to immersion in the present alkoxide salt solution for purposes of cleaning or softening and cleaning the resin surface prior to treatment.

Another option involves employing additional solvents within the preheated solution itself. Example 5 illustrates the use of the solvent ethoxyethanol with a solution of potassium tert-butoxide in tert-butyl alcohol. Other solvents that may be so employed include, but are not limited to, those common organic solvents listed above as pretreating solvents. Additionally, the organic solvent propanediol may be employed within the preheated solution. Such solvents serve various purposes, including to dissolve decomposition products formed in the practice of the invention; to dilute the preheated solution; to swell the undecomposed portion of the resin; and to smooth the surface of the resin.

Alternatively, a solvent may also be employed after the resin has been treated to achieve a smoother resin surface and to partially redissolve decomposition products. By rinsing the resin after treatment with a solvent, loose reaction products may be removed along with unreacted alkoxide and its solvent. Since the rinsing solvent is selected for its compatibility with the targeted reaction products and the unreacted alkoxide and its solvent, it is preferable to employ the solvent chosen for the alkoxide in the preheated solution itself as the rinsing solvent. Other solvents that may be so employed include, but are not limited to, those common organic solvents listed above as pretreating solvents.

The temperature of the solution is preferably maintained at a temperature within the range of about 70° to 120° C., with the most preferable temperature depending upon the particular cured cyanate ester resin being treated. At temperatures less than 70° C., the adhesion achieved in the practice of the invention may be less than optimal. On the other hand, at temperatures greater than 120° C., the chemical reaction rate is greatly accelerated so that the process may be uncontrollable. In reality, the upper temperature limit is often determined by the refluxing temperature of the solution. It is preferable in the practice of the invention that the process temperature be well below the boiling point of the solution.

In the practice of the invention, the resin surface remains immersed in the preheated solution for at least 10 seconds. Preferably, the resin remains immersed for a period of time ranging from 10 seconds to 20 minutes. An immersion of less than 10 seconds does not adequately prepare the surface for metal plating, while an immersion lasting more than 20 minutes dissolves an excessive amount of resin, resulting in loss of adhesion as well as the exposure of carbon fibers in composites.

At the conclusion of the immersion step, the resin surface is removed from the preheated solution, rinsed, and dried. The resin surface may be rinsed with water (preferably deionized), an organic solvent as described above, or a combination thereof. In the practice of the invention, the resin surface may be rinsed with room-temperature water and/or organic solvent from a beaker for 5 minutes or more, but typically 30 seconds of rinsing is sufficient. The drying step is preferably accomplished either by allowing the resin surface to air-dry at room temperature or by blowing the resin surface dry with a stream of nitrogen. Once dry, the resin surface is fully prepared for metal plating and may be plated at any time for up to one week.

The method used to perform the metal plating on the resin surface does not form part of the invention and may be accomplished by any of the conventional processes known in the art, such as electroplating, electroless chemistry, and sputtering. One traditional method entails four basic sequential steps and utilizes both electroless chemistry and electroplating. First, the resin surface is treated with an acidic solution of palladium chloride and stannous chloride. This acidic solution is available commercially; for example, it is sold under the trade name Cataposit 44 by Shipley. Second, the resin surface is treated with a hydrochloric acid accelerator, such as commercially-available Accelerator No. 19 from Shipley. Third, the resin surface is treated with an either a nickel or copper electroless plating solution. An electroless nickel plating solution is prepared by combining 150 ml of Solution A with 100 ml of Solution B, both of which are commercially available from Allied Kelite, and then diluting the 250 ml to 1 L with water. Alternatively, an electroless copper solution can be prepared by mixing Enplate Cu-700A (6% by volume), Enplate Cu-700B (6% by volume), Enplate Cu-700C (2.25% by volume), and water. Fourth, and finally, the resin surface is electroplated with a metal aside from the one contained in the electroless plating solution, such as silver. Optionally, the metal plated resin surface may then be baked to further harden the metal coating. At the conclusion of the metal plating process, a metal coating will have been applied to the resin surface, thereby providing the resin with a highly conductive surface.

The precise mechanism behind the improved quality of adhesion attained in the practice of the invention between a cured cyanate ester resin and plated metal is not known. Without subscribing to any particular theory, it appears that the alkoxide ion of the alkoxide salt solution wages a nucleophilic attack on the cured cyanate resin surface.

The method of the invention provides for adhesion between cured cyanate ester resins and metal deposited by plating, thereby enabling the formation of a highly conductive surface on cured cyanate ester resins and composites. The adhesion attained in the practice of the invention is generally very good according to ASTM method D3359B performance standards, as discussed in detail in the examples below.

EXAMPLES

The adhesion of the films in the following examples was tested according to ASTM method D3359 "Test Method B—Cross-Cut Tape Test" (hereinafter "ASTM method D3359B") which is specifically used to assess the adhesion of coating films to metallic substrates by applying and removing pressure-sensitive tape over cuts made in the film. In substantial accordance with this standard test, the films were first cut in a cross-hatch fashion using an Exacto knife, with six ¾-inch long cuts in one direction spaced 1.5 mm apart and with another six similarly-spaced ¾-inch cuts perpendicular over the first six. Following removal of loose pieces of film, a pressure-sensitive tape ranging from three to four inches in length was placed over the crosshatching, with the applied tape being rubbed with a pencil eraser to set it. After waiting from one to two minutes, the tape was removed by seizing the free end and pulling the tape back upon itself at approximately a 180° angle. The cross-hatched film was then visually compared to illustrations for grading the adhesion on a scale of 0 to 5. Three types of tape were typically used to test the adhesiveness, namely a 20-oz./inch tape, a 40-oz./inch tape, and a 135-oz. tape, all commercially available from 3M. Examples 1–8, which represent various working embodiments of the method of the invention, are followed by a compilation of non-working conditions to better illustrate the suitable bounds of the invention.

Examples 1–5 illustrate various embodiments of the method of the invention with regard to a cured composite molded from cured cyanate ester resin RS3 and XN-80 carbon fibers, both commercially available from YLA:

Example 1:

The composite was treated in a 25 wt % solution of sodium methoxide in methanol, the solution being under reflux and preheated to about 86° C. More specifically, the solvent vapor was contained by capping the container of refluxing solution with a ground glass stopper with a pyrex hook attached to its underside from which the composite was suspended into the refluxing solution. The composite remained immersed in the solution for a period of about 75 seconds. The composite was then removed from the solution and rinsed with water in a beaker for about 30 seconds. Finally, the composite was blown dry with a stream of nitrogen.

Upon completion of the practice of the invention, the composite was subjected to a conventional metal plating process. The composite was dipped in Cataposit 44 at room temperature for about 15 minutes, rinsed in water for about 5 seconds, dipped in Accelerator No. 19 at room temperature for about 15 minutes, rinsed again with water for about 15 seconds, and plated with electroless nickel for about 15 minutes at 92° C. The nickel deposition was generally carried out until a continuous coating of nickel was observed on the composite surface. The length of time required to achieve a continuous coating varied with the prior usage of the nickel solution, the quantity of nickel solution, and the size of the sample.

After rinsing the nickel-coated composite in a stream of water for about 15 seconds, the composite surface was immediately plated with silver in a silver strike solution (described below as Solution Y) at room temperature and a current density of 10 amps/ft$^2$. After about three seconds, plating was continued in a traditional silver cyanide plating bath (described below as Solution X) for about 5 to 15 minutes at 5 amps/ft$^2$. Finally, the plated composite surface was rinsed in flowing water and baked for about 30 minutes at 150° C.

The adhesion of the metal coating was tested according to the Cross-Cut Tape Test (ASTM method D3359B) using a 20oz./inch tape. The adhesion was classified as category 5, which characterizes the strongest adhesion.

Solution X: This solution was prepared by combining 20 g/l of silver in the form of $KAg(CN)_2$; 80 g/l of free KCN; and 15 g/l of $K_2CO_3$.

Solution Y: This solution was prepared by diluting 25 ml of Solution X (described above) to 100 ml with water.

Example 2:

The composite was treated with a 1.0M solution (14 wt %) of potassium tert-butoxide in tert-butyl alcohol, the solution refluxing at 87° C. The composite remained immersed in the solution for a period of about 15 minutes. The composite was then removed from solution, rinsed with water, dried, and then plated as described in Example 1.

The adhesion of the metal to the composite was tested according to ASTM method D3359B with an adhesive tape after crosshatching the coating. The adhesion was considered excellent and was rated between 4 and 5 with a tape of 20 oz./inch and 4 with a tape of 135 oz./inch.

Example 3:

The composite was treated with a 21 wt % solution of sodium ethoxide in denatured ethanol refluxing at 100° C. The composite remained immersed in the solution for a period of about 75 seconds. The composite was then removed from solution, rinsed with room-temperature water, dried, and then plated as described in Example 1.

The adhesion of the metal to the composite was tested according to ASTM method D3359B with an adhesive tape after crosshatching the coating. The adhesion was rated at category 4 with a tape of 20 oz./inch and 2 with a tape of 135 oz./inch.

Example 4:

The composite was treated with a 20 wt % solution of sodium methoxide in 1-butanol (boiling point=117° C.) that had been preheated to 91° C. The composite remained immersed in the solution for a period of about 1.5 minutes. The composite was then removed from solution, rinsed for about 1 minute in warm (about 40° C.) 1-butanol, then rinsed in room-temperature water for about 30 seconds, dried, and then plated as described in Example 1.

The adhesion of the metal to the composite was tested according to ASTM method D3359B with an adhesive tape after crosshatching the coating. The adhesion was rated at category 2 with 40 oz./inch and 135 oz./inch tapes, and 5 in areas that were not cross-hatched.

Example 5:

The composite was treated with a 1:1 mixture of 2-ethoxyethanol with a 1.0M (13.7 wt %) solution of potassium tert-butoxide in tert-butyl alcohol refluxing at 95° C. The composite remained immersed in the solution for a period of about 1 minute. The composite was then removed from solution, rinsed for about 15 seconds in 1-butanol measuring about 80° C., then rinsed in room-temperature water for about 15 seconds, dried, and then plated as described in Example 1.

The adhesion of the metal to the composite was tested according to ASTM method D3359B with an adhesive tape after crosshatching the coating. The adhesion was rated at category 2 with 40 oz./inch and 135 oz./inch tapes, and 5 in areas that were not cross-hatched.

Examples 6–7 illustrate various embodiments of the method of the invention with regard to a cured resin composite molded from cyanate ester resin BTCY-2 from Bryte:

Example 6:

The cured resin composite was treated with a 1.0M (13.7 wt %) solution of potassium tert-butoxide in tert-butyl alcohol refluxing at 87° C. The composite remained immersed in the solution for a period of about 15 minutes. The composite was then removed from solution, rinsed in room-temperature water, dried, and then plated as described in Example 1.

The adhesion of the metal to the composite was tested with 20-oz./inch tape according to ASTM method D3359B after crosshatching the coating. The adhesion was rated at category 3 in the cross-hatched area and 5 in areas that were not cross-hatched.

Example 7:

The cured resin composite was treated with a 25 wt % solution of sodium methoxide in methanol, the solution having been preheated to 76° C. The composite remained immersed in the solution for a period of about 75 seconds. The composite was then removed from solution, rinsed in room-temperature water, dried, and then plated as described in Example 1.

The adhesion of the metal to the composite was tested according to ASTM method D3359B after crosshatching the coating with a 40-oz./inch tape and a 135-oz./inch tape. The adhesion was rated at category 3 in the cross-hatched area and 5 in areas that were not cross-hatched.

Example 8 illustrates the practice of the invention with regard to a cured composite molded from cured cyanate ester resin X-1515, which is commercially available from Bryte:

Example 8:

A composite molded from cyanate ester polymer X-1515 by Bryte was dipped into a 1.0M (13.7 wt %) solution of potassium tert-butoxide in tert-butyl alcohol refluxing at 87° C., remaining immersed for 15 minutes. The treated composite was rinsed in room-temperature water and then plated as described in Example 1.

After crosshatching the coating, the adhesion of the metal coating was tested with 20-oz./inch tape. The adhesion was rated 2 to 3 in the cross-hatched area and 5 in the areas that were not cross-hatched.

Compilation of Non-Working Conditions:

Non-working examples include 5 minutes in 13 wt % sodium phenoxide trihydrate in phenol at 100° C. (the phenol dissolved the resin before the phenoxide etched the resin); 10 minutes in 13 wt % sodium phenoxide trihydrate in 3:1 phenol:methanol at 100° C. (the phenol still dissolved the resin before etching); 6 minutes in 12 wt % sodium phenoxide trihydrate in methanol plus 3 minutes in 25 wt % sodium phenoxide trihydrate in methanol at 70° C. (no reaction); 15 minutes in sodium phenoxide trihydrate in IPA (saturated) at reflux (no reaction); 15 minutes in 24 wt % sodium sulfide in water at 100° C. (no reaction); and 15 minutes in 34 wt % sodium acetate in water at 100° C. (no reaction).

Thus, there has been disclosed a method for improving the adherence of plated metal to cured resin and resin composite surfaces. It will be readily apparent to those of ordinary skill in this art that various changes and modifications of an obvious nature may be made without departing from the spirit of the invention, and all such changes and modifications are considered to fall within the scope of the invention, as defined by the appended claims.

What is claimed is:

1. A method of preparing the surface of a cured cyanate ester resin or cured cyanate ester resin composite for plating with metal, comprising:
   (a) providing a cured resin comprising a cyanate ester, said cured resin having a surface;
   (b) placing said surface in contact with a preheated solution comprising at least 1 wt % of an alkali metal salt of an alkoxide;
   (c) removing said surface from contact with said preheated solution;
   (d) rinsing said surface with a solution selected from the group consisting of water, alcohol, and a combination thereof; and
   (e) drying said surface, said surface thereby prepared to adhere to metal deposited by a subsequent metal plating process.

2. The method of claim 1 wherein said cured cyanate ester resin composite comprises graphite fibers in a cyanate ester matrix.

3. The method of claim 1 wherein the temperature at which said preheated solution is maintained is within the range of from about 70° to 120° C.

4. The method of claim 1 wherein said alkali metal salt of an alkoxide comprises an alkali metal ion and an alkoxide ion, said alkali metal ion selected from the group consisting of sodium and potassium, said alkoxide ion containing from one to twelve carbon atoms.

5. The method of claim 4 wherein said alkoxide ion is selected from the group consisting of methoxide, ethoxide, propoxide, iso-propoxide, butoxide, tert-butoxide, sec-butoxide, 2-methyl-2-butoxide, pentoxide, and hexoxide.

6. The method of claim 1 wherein said preheated solution further comprises at least one alcohol as a solvent for said alkali metal salt of an alkoxide.

7. The method of claim 6 wherein said at least one alcohol has from one to twelve carbon atoms.

8. The method of claim 7 wherein said alcohol has conjugate base, said conjugate base being identical said alkoxide ion selected for said preheated solution.

9. The method of claim 1 wherein said alkali metal salt of an alkoxide is present in said preheated solution at a concentration ranging from about 1 to 50 wt %.

10. The method of claim 1 wherein said surface is immersed in said solution.

11. The method of claim 1 wherein said surface remains in contact with said preheated solution for a period of time ranging from about 10 seconds to 20 minutes in duration.

12. The method of claim 1 wherein drying said surface is accomplished by allowing said surface to air-dry at room temperature.

13. The method of claim 1 wherein drying said surface is accomplished by exposing said surface to a stream of nitrogen.

14. The method of claim 1 further comprising, after step (e), plating an initial metal layer upon which subsequent metal layers may be thereafter deposited, said initial metal layer being selected from the group consisting of nickel and copper.

15. A method of preparing the surface of a cured cyanate ester resin or cured cyanate ester resin composite for plating with metal, comprising:
   (a) providing a material selected from the group consisting of a cured cyanate ester resin and a cured cyanate ester composite, said cured cyanate ester composite comprising graphite fibers embedded in a cured cyanate ester resin matrix, said material having a surface;
   (b) immersing said surface in a preheated solution comprising an alkali metal salt of an alkoxide and at least one alcohol, said alkali metal salt of an alkoxide comprising an alkali metal ion and an alkoxide ion, said alkali metal selected from the group consisting of sodium and potassium, said alkoxide having from one to twelve carbon atoms, said alkali metal salt of an alkoxide present at a concentration ranging from about 1 to 50 wt %, said preheated solution having a temperature within the range of about 70° to 120° C.;
   (c) removing said surface from contact with said preheated solution after a period of time ranging from about 10 seconds to 20 minutes in duration;
   (d) rinsing said surface with deionized water; and
   (e) drying said surface by exposing said surface to a stream of nitrogen, said surface thereby prepared to adhere to metal deposited by a subsequent metal plating process, the quality of adhesion ranging from about 2 to 5 as measured by ASTM method D3359B.

16. The method of claim 15 wherein said alkoxide ion is selected from the group consisting of methoxide, ethoxide, propoxide, iso-propoxide, butoxide, tert-butoxide, sec-butoxide, 2-methyl-2-butoxide, pentoxide, and hexoxide.

17. The method of claim 15 wherein said at least one alcohol has from one to twelve carbon atoms.

18. The method of claim 17 wherein said alcohol has a conjugate base said conjugate base being identical to said alkoxide ion selected for said preheated solution.

19. The method of claim 15 further comprising, after step (e), plating an initial metal layer upon which subsequent metal layers may be thereafter deposited, said initial metal layer being selected from the group consisting of nickel and copper.

* * * * *